United States Patent [19]

Ogura

[11] Patent Number: 5,060,010
[45] Date of Patent: Oct. 22, 1991

[54] IMAGE FORMING APPARATUS AND LEADER SHEET THEREFOR

[75] Inventor: Mitsuru Ogura, Nara, Japan

[73] Assignee: Sharp Kabushiki Kaisha, Osaka, Japan

[21] Appl. No.: 584,751

[22] Filed: Sep. 19, 1990

[30] Foreign Application Priority Data

Sep. 27, 1989 [JP] Japan .................................. 1-251603

[51] Int. Cl.⁵ ............................................ G03B 27/52
[52] U.S. Cl. ...................................... 355/27; 355/100
[58] Field of Search ................................ 355/27–29, 355/100, 106, 212

[56] References Cited

U.S. PATENT DOCUMENTS

| | | | |
|---|---|---|---|
| 3,645,473 | 2/1972 | Kitch | 242/210 |
| 4,399,209 | 8/1983 | Sanders | 430/138 |
| 4,912,510 | 3/1990 | Ogura et al. | 355/212 |
| 4,994,856 | 2/1991 | Koichi | 355/27 |

*Primary Examiner*—L. T. Hix
*Assistant Examiner*—D. Rutledge

[57] ABSTRACT

An image forming apparatus with comprises a pair of pinch rolls operable to press a web of donor sheet, supplied from a roll thereof, a receptor sheet together to accomplish an image development by an application of a pressure thereto, and an automatic loader operable to set a leader sheet, secured to a radially outermost end of the roll of donor sheet, in a sheet transport path including the pinch roll pair and then to secure the leader sheet to a take-up spool having an adhesive region formed thereon for connection with the leader sheet. The take-up spool is driven in a first direction about a longitudinal axis of the take-up spool during an automatic loading and in a second direction counter to the first direction about the longitudinal axis of the take-up spool during an image forming operation. The leader sheet has a leading end which is wound around and secured to the take-up spool then driven in the first direction, and the remainder of the leader sheet is folded backwards along a score line, defined therein, to overlay the leading end. The leading end of the leader sheet is formed with at least one through-hole for connection of the remainder of the leader sheet with the adhesive region on the take-up spoon through the through-hole after it has been folded backwards.

2 Claims, 5 Drawing Sheets

IMAGE FORMING APPARATUS AND LEADER SHEET THEREFOR

BACKGROUND OF THE INVENTION

1. Field of the Invention

The present invention generally relates to an image forming apparatus of a type utilizing a roll of donor sheet and a receptor sheet in the form of a cut sheet and, more particularly, to a sheet transport mechanism used in the image forming apparatus of the type referred to above.

2. Description of the Prior Art

An apparatus for and a method of duplicating an image with the use of a roll of donor sheet and a receptor sheet in the form of a cut sheet are well known in the art. The roll of donor sheet is sensitive to rays of light and also to pressure and comprises a rolled form of a length of sheet having microcapsules coated on one surface thereof, each of said microcapsules encapsulating a mixture of photo-curable or photo-setting material with an image forming agent, whereas the receptor sheet is of a type having at least one surface coated with chromogenic developing material. The image duplicating method using the roll of donor sheet and the receptor sheet is performed in the following manner.

When a web of donor sheet is exposed to imagewise rays of light carrying an image of an original to be duplicated, a latent image is formed thereon which is a negative image corresponding in pattern to the image of the original. The term "negative image" used hereinabove and hereinafter is intended to means that some of the microcapsules situated outside the pattern of the imagewise rays of light projected onto the web of donor sheet are cured or hardened by exposure to light enough to be unable to rupture.

When this web of donor sheet having the latent image formed thereon is placed on the receptor sheet with the microcapsule coated surface thereof facing the surface of the receptor sheet which has been coated with chromogenic developing material, and the both are subsequently pressed together by the application of a pressure, the remaining, uncured microcapsules on the web of donor sheet which represent the latent image are ruptured. Once the remaining, uncured microcapsules are ruptured, the image forming agents, which have been encapsulated in the ruptured microcapsules, flow over that surface of the receptor sheet and then react therewith to develop a colored positive image corresponding in pattern to the image of the original. An example of the combination donor sheet and receptor sheet are disclosed in, for example, U.S. Pat. No. 4,399,209 (corresponding to the Japanese Laid-open Patent Publication No. 58-88739, published in 1983).

Because the donor sheet is sensitive not only to external rays of light, but also to an external pressure, the donor sheet is housed in the form of a roll within a media cartridge for the purpose of protecting it from accidental application of light and pressure thereto. The cartridge accommodating the roll of donor sheet is generally so designed as to be selectively loaded into and removed out of the image forming apparatus.

As a matter of course, the roll of donor sheet within the cartridge has a leader sheet of sufficient rigidity secured to a radially outermost end of the rolled donor sheet and partially exposed to the outside from a slit defined in the cartridge. The leader sheet partially protruding outwards from the cartridge is used to secure the donor sheet therethrough to an automatic loading means, when the cartridge is placed inside the image forming apparatus, so that the web of donor sheet can be guided through a transport passage and past an image transfer station at which the image forming agents, which have been encapsulated in the ruptured microcapsules, can progressively flow over that surface of the receptor sheet to develop a colored positive image corresponding in pattern to the image of the original. An example of the cartridge containing the roll of donor sheet and the manner in which the web of donor sheet is guided are disclosed in, for example, U.S. Pat. No. 4,912,510, issued Mar. 27, 1990 (corresponding to the Japanese Laid-open Patent Publication No. 1-54445, published Mar. 1, 1989).

On the other hand, the receptor sheet is generally employed in the form of a cut sheet for reasons of convenience after the image duplication and/or some other reasons, and is usually supplied either manually or automatically from a paper supply unit accommodating a stack of receptor sheets. At the transfer station along the transport passage defined in the image forming apparatus, the web of donor sheet exposed to the imagewise rays of light during its movement in the transport passage is mated with the receptor sheet as the both are passed through a nipping area defined between a pair of pinch rolls so as to develop the colored positive image on the receptor sheet. Thereafter, the web of donor sheet which has been consumed is take up around a take-up spool disposed within the image forming apparatus whereas the receptor sheet having the colored positive image developed thereon is, after having been separated from the web of donor sheet by the action of a peeling shaft and a scraper both disposed downstream of the pinch rolls with respect to the direction of transport of the web of donor sheet, heat-treated in a bright finishing unit and is then ejected outwardly from a paper ejector unit in the image forming apparatus.

The prior art image forming apparatus of the type described above has a problem associated with the separation of the receptor sheet from the web of donor sheet which is effected after the image development. Specifically, the separation of the receptor sheet from the web of donor sheet at the peeling shaft downstream of the pinch roll pair cannot be accomplished satisfactorily and tends to be adversely affected by environmental conditions such as, for example, ambient humidity.

If the separation of the receptor sheet from the web of donor sheet does not take place satisfactorily, machine troubles would occur such as a paper jamming caused by the receptor sheet or an unwanted take-up of the receptor sheet together with the web of donor sheet.

Accordingly, the present invention has for its primary object to provide an improved image forming apparatus effective to accomplish a satisfactory separation of the receptor sheet from the web of donor sheet subsequent to the image development regardless of any environmental condition.

Another important object of the present invention is to provide a leader sheet coupled to the roll of donor sheet used in the image forming apparatus of the type referred to above.

SUMMARY OF THE INVENTION

According to one aspect of the present invention, there is provided an image forming apparatus which comprises a pair of pinch rolls operable to press a web of donor sheet, supplied from a roll thereof, and a receptor sheet together to accomplish an image development, and an automatic loading means operable to set a leader sheet, secured to a radially outermost end of the roll of donor sheet, in a transport passage means including the pinch roll pair and then to secure the leader sheet to a take-up spool having an adhesive region formed thereon for connection with the leader sheet. The image forming apparatus also further comprises a direction control means for controlling the take-up spool so as to rotate in one of opposite directions, for example, clockwise, about the longitudinal axis of the take-up spool during an automatic loading and so as to rotate in the other of the opposite direction, i.e., counterclockwise, about the longitudinal axis of the take-up spool during an image forming operation.

According to another aspect of the present invention, there is provided a leader sheet secured at one end to the radial outermost end of the rolled donor sheet. A free end portion of the leader sheet remote from the donor sheet has a score line defined therein so as to extend perpendicular to the longitudinal sense of the sheet for facilitating a fold of the leader sheet when the direction of rotation of the take-up spool is changed. The free end portion of the leader sheet has at least one through-hole defined therein so that a corresponding portion of the leader sheet aligned with the through-hole when the free end portion thereof has been folded along the score line can be bonded to the adhesive region on the take-up roll through such through-hole.

BRIEF DESCRIPTION OF THE DRAWINGS

These and other objects and features of the present invention will become clear from the following description taken in conjunction with a preferred embodiment thereof with reference to the accompanying drawings, in which.

DETAILED DESCRIPTION OF THE EMBODIMENT

Figure 1:
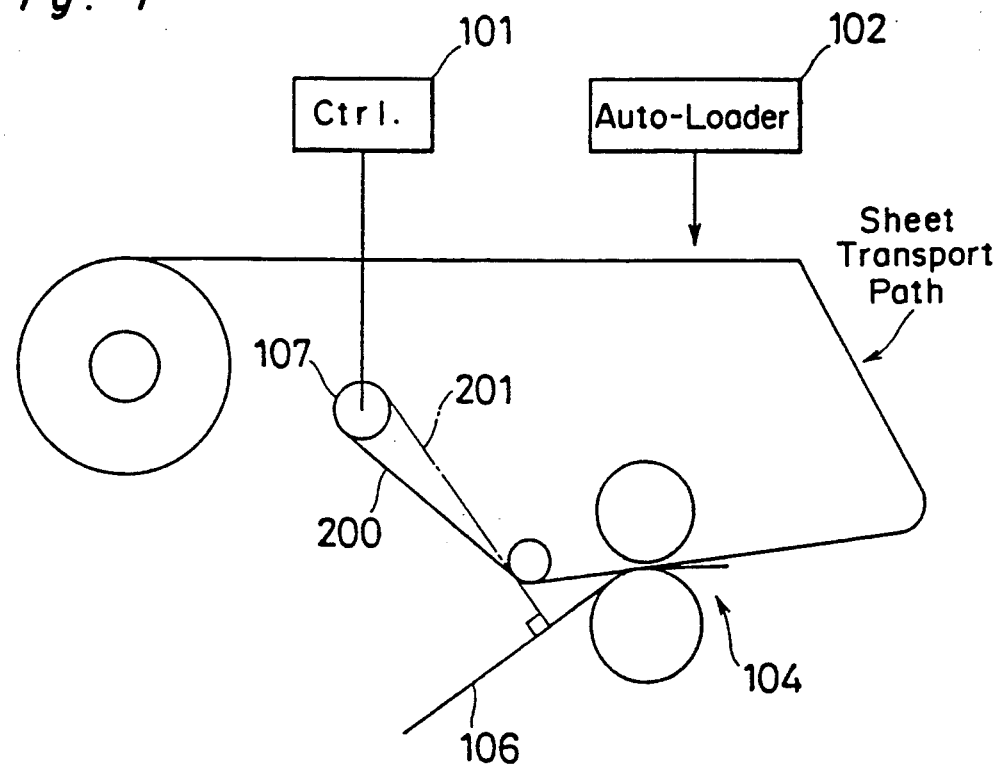
FIG. 1 is a schematic line diagram showing a sheet transport mechanism embodying the present invention.

Reference is first made to FIG. 1 to briefly discuss the manner in which a web of donor sheet extending from a roll of donor sheet and having a leading end thereof to which a leader sheet according to the present invention is secured is guided along a sheet transport path and taken up around a take-up spool 107. The roll of donor sheet of the type hereinbefore discussed is accommodated within a media cartridge. When the media cartridge is installed in position within an image forming apparatus embodying the present invention, an automatic loading means 102 pulls the leader sheet outwardly from the media cartridge and loads it automatically on and along a sheet transport path including a pair of pinch rolls 140. At this time, a direction control means 101 causes the take-up spool 107 to rotate clockwise about the longitudinal axis of the take-up spool 107 as viewed in FIG. 1. For this reason, the leader sheet can be smoothly transported towards the take-up spool 107 through a moderately inclined delivery passage 200 and is, once a free end of the leader sheet is caught by an adhesive region on the take-up spool 107, wound up around the take-up spool 107 in a direction substantially conforming to the direction of travel of the leader sheet. Since the direction in which the free end of the leader sheet is wound around the take-up spool 107 conforms to the direction in which the leader sheet has been turned by and around various guide rolls disposed along the sheet transport path, the winding of the leader sheet around the take-up spool 107 can take place easily and smoothly.

After the leader sheet has been wound up substantially a single turn around the take-up spool 107, the direction control means 101 reverses the direction of rotation of the take-up spool 107 and causes the latter to rotate counterclockwise about the longitudinal axis thereof. Since a free end portion of the leader sheet has a score line defined therein so as to extend perpendicular to the longitudinal sense of the sheet as will be described later, the change in direction of rotation of the take-up spool 107 from the clockwise direction to the counterclockwise direction causes the leader sheet to be folded 180° backwards along the score line, allowing the leader sheet to follow the counterclockwise rotation of the take-up spool 107.

In addition, since an end portion of the leader sheet situated on one side of the score line remote from the web of donor sheet has at least one through-hole defined therein and since a portion of the adhesive region on the take-up spool 107 is exposed to the outside through the through-hole after the leader sheet has been folded backwards along the score line, an area of another portion of the leader sheet situated on the opposite side of the score line adjacent the web of donor sheet, which overlaps said end portion of the leader sheet having the through-hole as a result of the backward fold along the score line, is bonded to the adhesive region on the take-up spool 107 through such through-hole. Consequent upon the change in direction of rotation of the take-up spool 107, a web of donor sheet following the leader sheet and having passed through a nipping area between the pinch rolls 104 moves along a different delivery passage 201 which extends perpendicular to the receptor sheet 106. The angle between the delivery passage 201 and the receptor sheet 106 can increase in excess of 90° as the web of donor sheet is progressively wound up around the take-up spool 107.

Thus, according to the present invention, the take-up spool can be driven in such one of the opposite directions about the longitudinal axis thereof during the automatic loading operation that the leader sheet can readily be wound up around the take-up spool, but in the other of the opposite direction during the image forming operation to establish an angle of 90° or greater between the delivery passage and the receptor sheet to ensure a firm separation of the receptor sheet from the web of donor sheet at a location immediately preceding the nipping area. Thus, the take-up spool can be driven in the clockwise direction up until the completion of the automatic loading operation including a reading of sensitivity information and, thereafter, the direction control means reverses the direction of rotation of the take-up spool to permit the latter to be driven counterclockwise to wind up the web of donor sheet during the image forming operation. Accordingly, the receptor sheet can be assuredly separated from the web of donor sheet.

The details of the image forming apparatus according to the preferred embodiment of the present invention employing the above described principle of operation will now be described with particular reference to FIG. 2 to 7.

Figure 7:
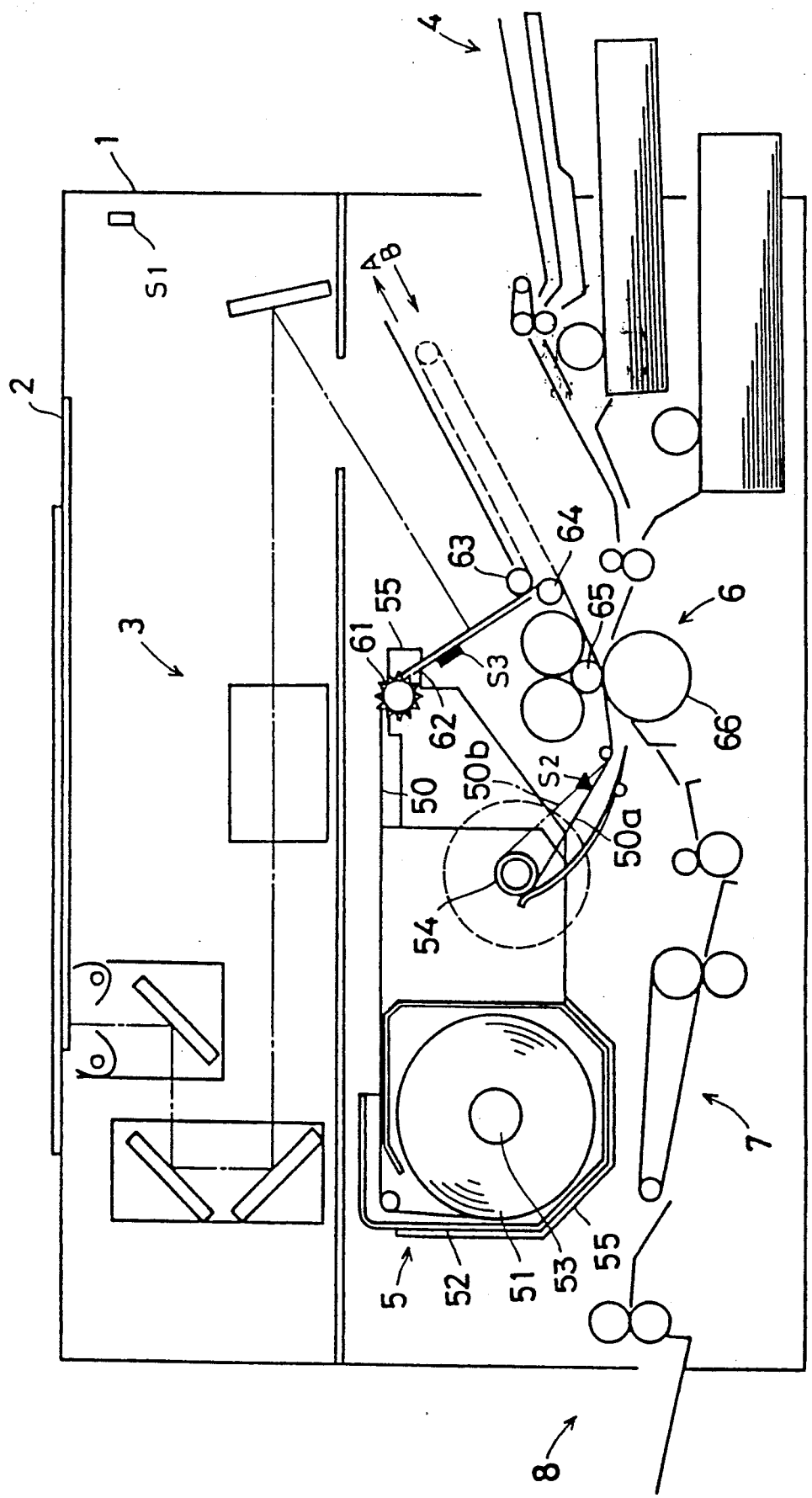
FIG. 7 is a schematic side sectional view of the image forming apparatus embodying the present invention.

Referring first to FIG. 7, the image forming apparatus shown therein makes use of a roll of donor sheet having microcapsules coated on one surface thereof, each of said microcapsules encapsulating a mixture of photo-curable or photo-setting material with an image forming agent, in combination with a receptor sheet of a type having at least one surface coated with chromogenic developing material. The image forming apparatus comprises a generally rectangular boxlike housing 1 having a document support 2 defined atop the housing 1 for the support thereon of a document to be duplicated, and an optical system 3 housed within an upper compartment of the housing 1 and including a light source, a plurality of mirrors and a projector lens assembly. The optical system 3 including the document support 2 may be of any known design, for example, of a design similar to that generally employed in an electrostatic copying machine and, therefore, the details thereof will not be herein described.

At a right-hand lower end portion of the housing 1 as viewed in FIG. 7, the image forming apparatus has a paper supply unit 4 including a manual paper feed tray and automatic paper feed trays accommodating therein respective stacks of receptor sheets of different size, which unit 4 may be of a design similar to that generally used in the electrostatic copying machine.

A media cartridge 5 comprising a casing 52 made of opaque, light shielding material and accommodating therein the roll of donor sheet 51 is received in a bucket 55 installed within the housing 1 at a location offset leftwards, as viewed in FIG. 7, from a center portion of the housing 1. A length of donor sheet 51 is, after having been rolled around a removable supply spool 53 forming a part of the media cartridge 5 with a radially outermost end of the donor sheet connected with a leader sheet 50, accommodated within the casing 52 with the leader sheet 50 extending outwardly from the casing 52. The casing 52 has a slit defined therein through which a web of donor sheet can be pulled outwardly.

The image forming apparatus shown in FIG. 7 has a sheet transport path extending from the slit in the casing 52 to a take-up spool 54 carried by the media cartridge 5. Along this sheet transport path from the slit in the casing 52 to the take-up spool 54, there is sequentially disposed a tractor roller 61, an exposure back-up plate 62, a guide roll 63, a buffer roll 64, and a pair of pinch rolls 65 and 66. A bright finishing unit 7 and a paper receiving tray 8 are installed within the housing 1 at respective locations immediately beneath the media cartridge 5 and a left-hand lower end portion of the housing 1.

In FIG. 7, reference character S1 represents a detector switch disposed at a right-hand upper portion of the housing 1 for detecting the selective opening and closure of a front access door, and reference character S2 represents a microswitch disposed at a position generally upstream of the take-up spool 54 for detecting the winding of the leader sheet L50 around the take-up spool 54.

The manner in which the image of the document placed on the document support 2 is duplicated will now be described. Assuming that the document having an image to be duplicated is placed on the document support 2, the optical system 3 scans the document. At this time, the buffer roll 64 is moved in a direction shown by the arrow A to allow imagewise rays of light transmitted through the optical system 3 to be radiated to a web of donor sheet 51 on the exposure back-up plate 62 thereby to accomplish a slit-exposure. Consequent upon the exposure of the web of donor sheet 51 to the imagewise rays of light, a latent image is formed thereon which is a negative image corresponding in pattern to the image of the document. As hereinbefore described, the formation of the latent image on the web of donor sheet 51 results in that some of the microcapsules situated outside the pattern of the imagewise rays of light projected onto the web of donor sheet are cured or hardened.

After the exposure, the take-up roll 54 is driven to cause the length of donor sheet to pull the buffer roll 64 in a direction shown by the arrow B, i.e., in a direction counter to the direction A, allowing that web of donor sheet 51 bearing the latent image to be transported towards a pressure developing station 6 defined at the nipping area between the pinch rolls 65 and 66. On the other hand, one of the receptor sheets stacked in one of the paper feed trays is supplied from such one of the paper feed trays towards the pressure developing station 6 in timed relationship with that web of donor sheet 5 such that the leading edge of the selected receptor sheet can arrive at the pressure developing station 5 simultaneously with the arrival of a leading end of that web of donor sheet 51 at such pressure developing station 6.

When that web of donor sheet having the latent image formed thereon is mated with the receptor sheet with the microcapsule coated surface thereof facing the developer coated surface of the receptor sheet and the both are subsequently pressed together by the application of a pressure as they pass through the nipping area between the pinch rolls 65 and 66. As they pass through the nipping area, the remaining, uncured microcapsules on the web of donor sheet which represent the latent image are ruptured and the image forming agents, which have been encapsulated in the ruptured microcapsules, flow over that developer coated surface of the receptor sheet to react therewith to develop a colored positive image corresponding in pattern to the image of the original, thereby completing the pressure development.

After the pressure development, that web of donor sheet is wound up on the take-up spool 54, then driven counterclockwise as viewed in FIG. 7, having passed along a delivery passage 50b, while the receptor sheet bearing the positive image is ejected onto the paper receiving tray 8 after having been heat-treated through the bright finishing unit 7.

The automatic loading operation of the image forming apparatus takes place in the following manner. It is to be noted that the radial outermost end of the length of donor sheet would around the supply spool 53 is connected with the leader sheet 50 of a design according to the present invention as will be described in detail later, and that this leader sheet 50 is, before the media cartridge 5 is loaded into the image forming apparatus, partially exposed to the outside through a slit defined in the cartridge housing 52.

The media cartridge 5 removed from a package can be loaded into the image forming apparatus by pulling the bucket 55 outwardly from the housing 1 and placing the media cartridge 5 onto the bucket 55. As hereinbefore described, within the cartridge housing 52, the length of donor sheet is mounted on the supply spool 53 in the form of a roll with the leader sheet 50 rigidly secured to the radial outermost end of the roll of donor sheet. Then, the leader sheet 50 is to be pulled outwardly from the slit in the cartridge housing 52 and then trained around the tractor roller 61 so that sprockets on the tractor roller 61 can be engaged in corresponding perforations (not shown) formed in a row on the leader sheet 50. Thereafter, the bucket 55 with the media cartridge 5 thereon is pushed into the image forming apparatus, followed by a closure of the front door. The closure of the front door result in switching on of the detector switch S1 to start the automatic loading operation.

The automatic loading operation starts with the drive of the tractor roller 1 to feed the leader sheet sequentially past the exposure back-up plate 62, the buffer roll 64 and then through the nipping area between the pinch rolls 65 and 66. After the leading end of the leader sheet 50 has entered the nipping area between the pinch rolls 65 and 66 held in contact with each other, the leader sheet 50 can be passed through the nipping area by the drive of the pinch rolls 65 and 66 towards the take-up spool 54 and the leading end of the leader sheet 50 is then turned around the take-up spool 54 while adhering to an adhesive region on the take-up spool 54 as will be described in detail later. Since at this time the take-up spool 54 is driven clockwise as viewed in FIG. 7, the delivery passage extending from the nipping area to the take-up spool 54 assumes a position indicated by 50a.

After the leading end of the leader sheet 50 has been positively secured to the take-up spool 54, the remaining portion of the leader sheet 50 extending in the delivery passage is held taut and hence contacts an actuator of the microswitch S2 to cause the latter to be switched on, thereby completing the winding of the leader sheet 50 around the take-up spool 54. Upon completion of this winding, the take-up spool 54 is reversed to rotate counterclockwise as viewed in FIG. 7 to allow the delivery passage, for the passage of the leader sheet and for the subsequent passage of the length of donor sheet 51, to shift to a position shown by 50b.

The details of the leader sheet 50 and its relationship with the take-up spool 54 will now be described with particular reference to FIGS. 4 to 6.

Figure 4:
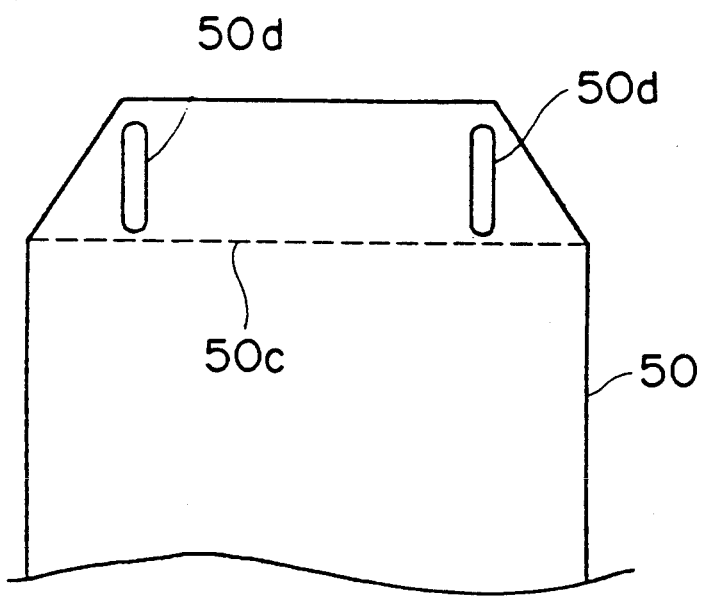
FIG. 4 is a top plan view of a leader sheet according to the present invention.
Figure 5:
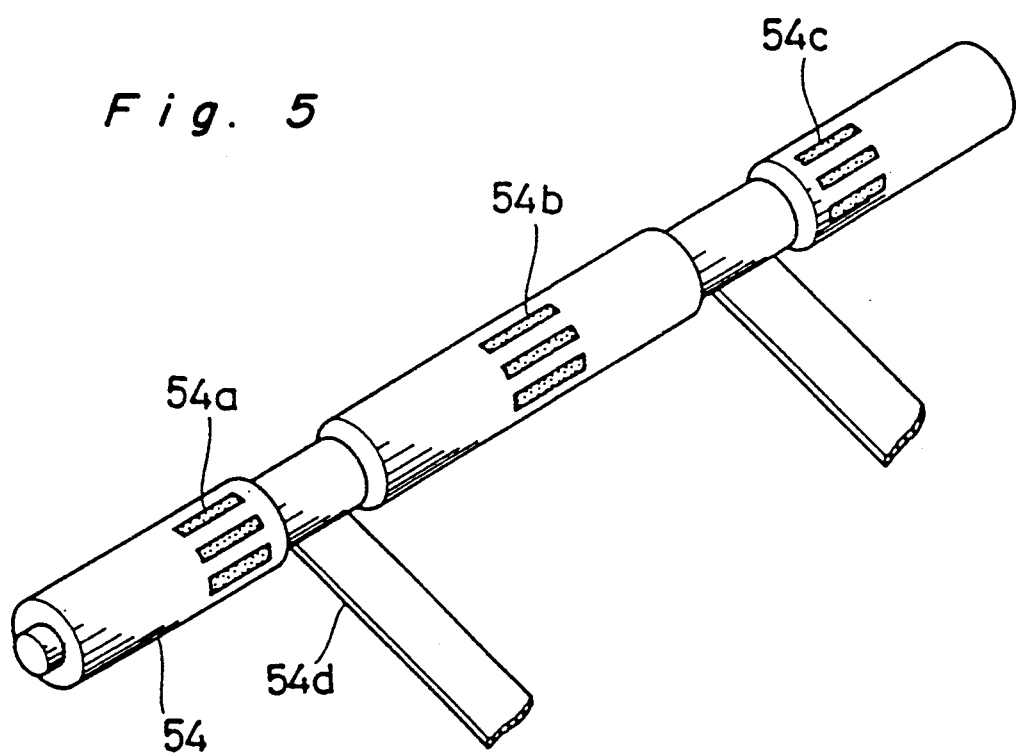
FIG. 5 is a perspective view of a take-up spool used in a media cartridge employed in the image forming apparatus according to the present invention.
Figure 6A:
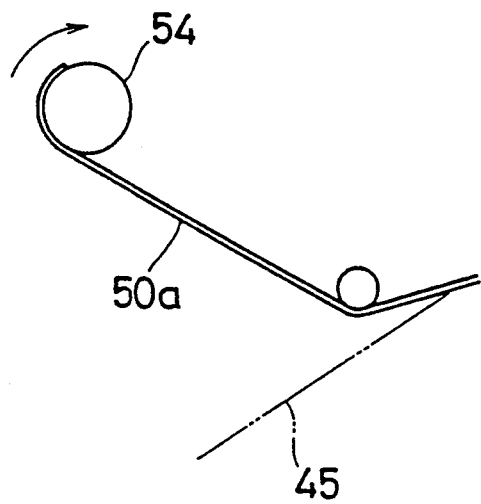
FIGS. 6(A) to 6(C) are schematic diagrams showing a change in path of travel of the leader sheet being take up around the take-up spool as a result of the controlled change in direction of rotation of the take-up spool, respectively.
Figure 6B:
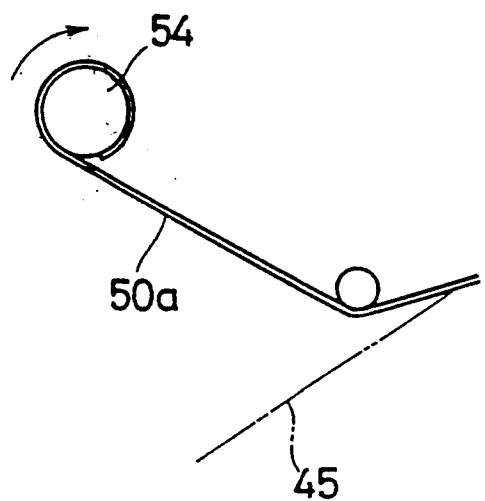
Figure 6C:
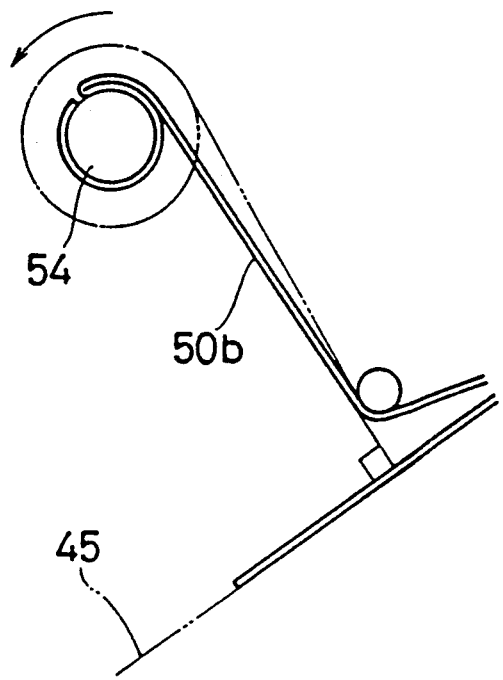

A free end portion of the leader sheet 50 is best shown in FIG. 4 in plan view, and the take-up spool 54 is best shown in FIG. 5 in perspective view. FIGS. 6(A) to 6(C) illustrate the sequence of how the delivery passage shifts depending on the direction of rotation of the take-up spool 54. As shown in FIG. 4, the leading end of the leader sheet 50 has its opposite corner regions cut away slantwise to represent a generally trapezoidal shape. This leading end of the leader sheet 50 is delimited from the remainder of the leader sheet 50 by the presence of a score line indicated by 50c and extending widthwise thereof. This leader sheet 50 also has a pair of slot-shaped through-holes 50d defined in the leader end thereof so as to lie in a direction lengthwise of the leader sheet 50.

Referring now to FIG. 5, the take-up spool 54 has its outer peripheral surface applied with three groups of adhesive strips 54a, 54b and 54c, the adhesive strips of each group being circumferentially spaced from each other while each adhesive strip extends longitudinally of the take-up spool 54. The group of adhesive strips 54b is positioned intermediate between the remaining groups of adhesive strips 54a and 54b which are positioned adjacent the opposite ends of the take-up spool 54. The two groups of adhesive strips 54a and 54c are spaced from each other a distance corresponding to the distance of separation between the through-holes 50d defined in the leading end of the leader sheet 50 as best shown in FIG. 4. Preferably, the length of each of the groups of adhesive strips 54a, 54b and 54c is chosen to be greater than the width of each of the through-holes 50d in the leader sheet 50.

In FIG. 5, reference numeral 54d represents a pair of strip-shaped guides extending along the delivery passage with their one ends slidingly engaged to the take-up spool 54 for guding the leader sheet 50 so as to ensure an engagement of, and a subsequent turn, of the leading end of the leader sheet 50 with respect to the take-up spool 54.

In operation, the leader sheet 50 delivered by the drive of the pinch rolls 65 and 66 is guided along the guide strips 50d with the leading end thereof subsequently turned around the take-up spool 54 in one direction while adhering to the adhesive strips 54a, 54b and 54c. At this time, since the leading end of the leader sheet 50 is formed with the through-holes 50d, respective portions of the two groups of adhesive strips 54a are exposed through the through-holes 50d without being bonded to corresponding portions of the leading end of the leader sheet 50.

However, those portions of the two groups of adhesive strips 54a and 54c are bonded to the corresponding portions of the leading end of the leader sheet 50 when and after, upon completion of a substantially single turn of the leading end of the leader sheet 50 around the take-up spool 54 driven in one direction, the take-up spool 54 is caused to rotate in the opposite direction with the leader sheet 50 consequently folded backwards along the score line 54c to overlay that single turn of the leading end of the leader sheet 50 on the take-up spool 54. In this condition, a portion of the leader sheet 54 following the leading end, which eventually forms a second turn on the take-up spool 54, is partially bonded to those portions of the two groups of adhesive strips 54a and 54b which have been exposed through the through-holes 50d in the leading end of the leader sheet 50.

Reference is now made to FIG. 6 to illustrate how the delivery passage extending from the nipping area to the take-up spool 54 shifts. FIG. 6(A) illustrates the condition in which the take-up roll 54 is driven clockwise. In this condition, the delivery passage is as indicated by 50a and forms an angle smaller than 90° relative to a delivery path 45 for the passage of the receptor sheet therethrough after it has emerged from the nipping area. The smaller angle than 90° between the delivery passage 50a and the delivery path 45 is effective to facilitate the automatic winding of the leader sheet 50 around the take-up spool 54.

FIG. 6(B) illustrates the condition in which the leader sheet 50 has been wound a substantially single turn around the take-up spool 54 still driven in the clockwise direction. FIG. 6(C) illustrates the condition in which the direction of rotation of the take-up spool 54 has been reversed with the take-up spool 54 consequently driven counterclockwise, in which condition the leader sheet 50 has been folded 180° backwards along the score line 50c and, at the same time, the delivery passage through which the leader sheet 50 and, subsequently, the web of donor sheet, is passed shifts to a position shown by 50b. The counterclockwise rotation of the take-up spool 54 continues until the whole length of donor sheet is consumed for the image duplication.

In the condition of FIG. 6(C), those portions of the two groups of adhesive strips 54a and 54c are bonded to the corresponding portions of the leading end of the leader sheet 50 as hereinbefore discussed. In other words, that portion of the leader sheet 54 following the leading end, which eventually forms a second turn on the take-up spool 54, is partially bonded to those portions of the two groups of adhesive strips 54a and 54b which have been exposed through the through-holes 50d in the leading end of the leader sheet 50.

Once the condition shown in FIG. 6(C) has been established, the angle formed between the delivery passage 50b and the delivery path 45 is substantially equal to 90° and this angle progressively increases with an increase in diameter of the roll of the donor sheet taken up by the take-up spool 54, that is, as the length of donor sheet is wound in a number of turns around the take-up spool 54.

A series of experiments conducted to determine any possible influence brought about environmental condition have shown that, if the angle of separation at which the receptor sheet separates from the web of donor sheet after the both have passed through the nipping area between the pinch rolls 65 and 66 is not smaller than 90°, the positive separation of the receptor sheet away from the web of donor sheet can take place assuredly. Therefore, the angle between the delivery passage 50b and the delivery path 45, which is equal to or greater than 90° as discussed above is effective to ensure the positive separation of the receptor sheet away from the web of donor sheet.

Figure 3:
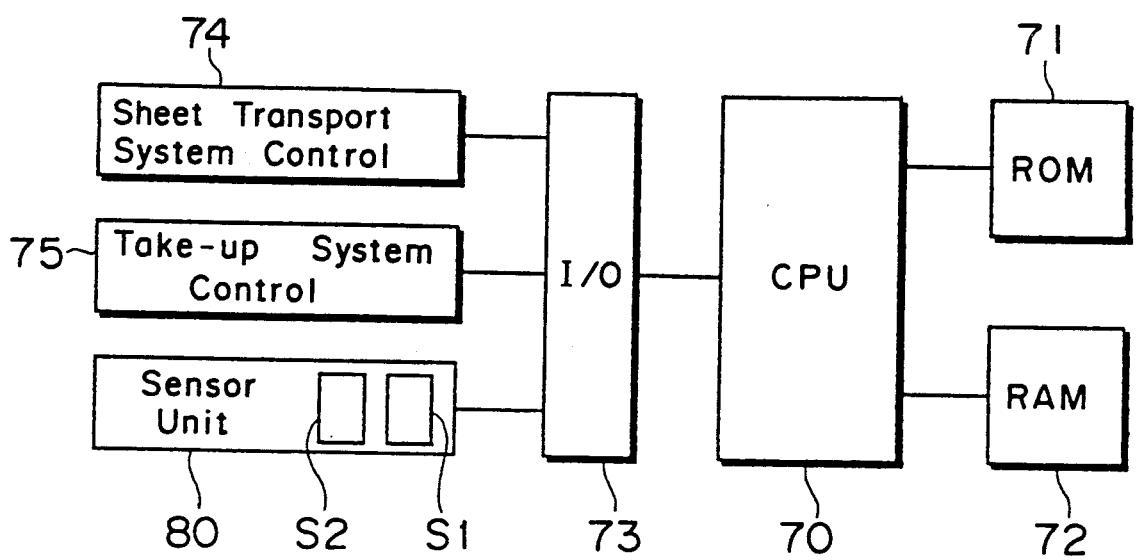
FIG. 3 is a block circuit diagram showing a control system used in the image forming apparatus according to the present invention.

Referring to FIG. 3, there is shown a block circuit diagram of a control system of the image forming apparatus. As shown in FIG. 3, a central processing unit (CPU) 70 is connected with a read-only memory (ROM) 71 and a random access memory (RAM) 72 and also through an input/output (I/O) interface 73 with a sheet transport system control 74, a take-up system control 75 and a sensor unit 80 including the switches S1 and S2.

The central processing unit 70 is used to control the overall operation of the image forming apparatus according to a control program stored in the read-only memory 71. The random access memory 72 is allocated with working areas for a timer and others. When the detector switch S1 is switched on indicating the closure of the front door of the housing 1, the ON signal from the detector switch S1 is supplied through the I/O interface 73 to the central processing unit 70 which in turn outputs a drive signal to the sheet transport system control 74 and, also, a clockwise signal to the take-up system control 75 for driving the take-up spool 54 in the clockwise direction. When the microswitch S2 is switched on, the ON signal from the microswitch S2 is supplied through the I/O interface 73 to the central processing unit 70 which in turn outputs a counterclockwise signal through the I/O interface 73 to the take-up system control 75 for driving the take-up spool 54 in the counterclockwise direction. It is to be noted that, during the image forming operation, the central processing unit 70 outputs, after each exposure process, a drive signal to the sheet transport system control 74 and a counterclockwise signal to the take-up system control 75 for driving the take-up spool 54 in the counterclockwise direction.

Figure 2:
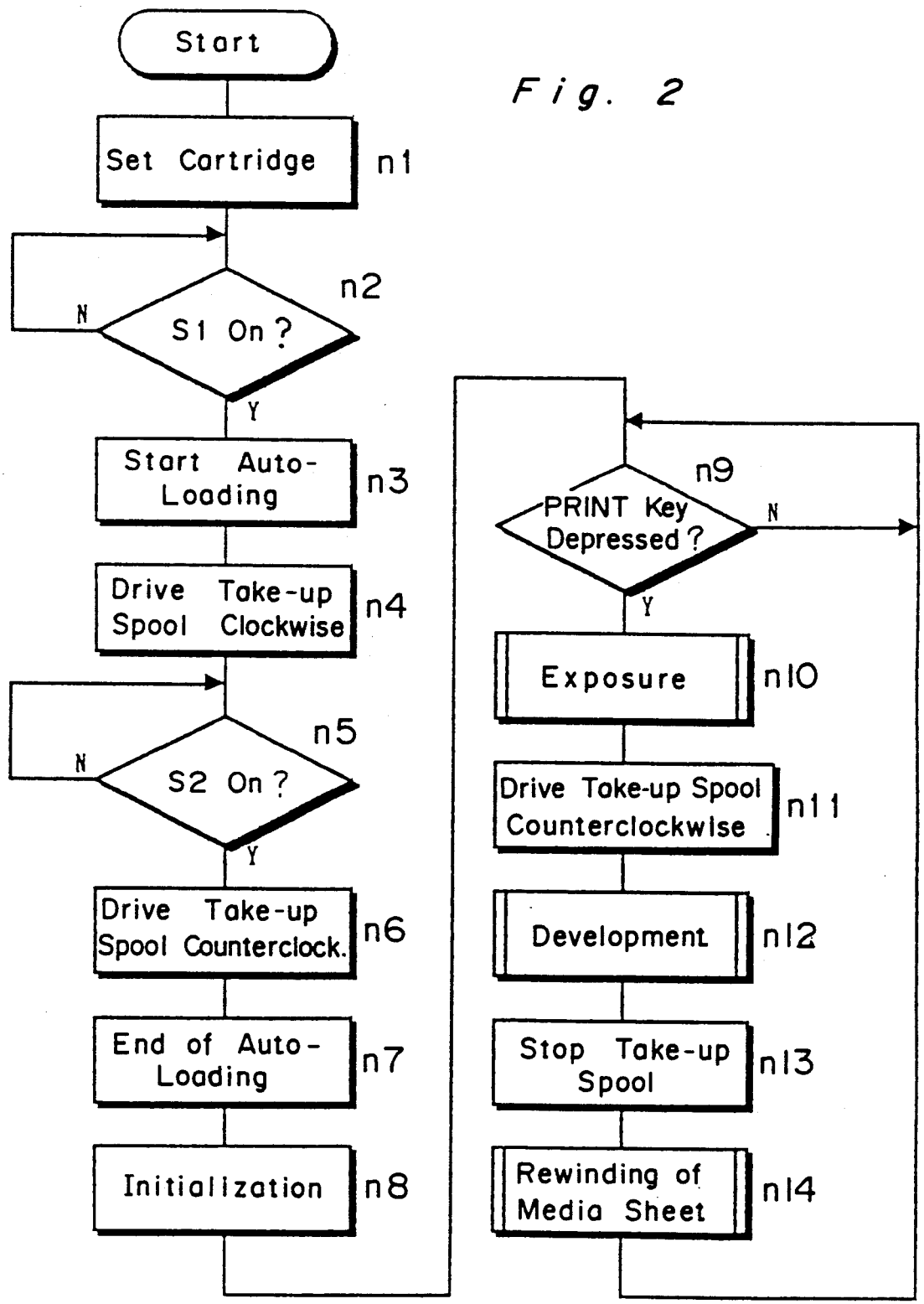
FIG. 2 is a flowchart showing the sequence of operation of an image forming apparatus according to the present invention, including an image forming operation and an automatic leader loading operation.

FIG. 2 is a flowchart showing the sequence of operation of an image forming apparatus including an image forming operation and an automatic leader loading operation. Referring to FIG. 2, at the outset, the front door (not shown) of the housing 1 is opened to install the media cartridge with the leader sheet set in position at step n1 in the manner as hereinbefore described. The subsequent closure of the front door of the housing 1 results in a closure of the detector switch S1 at step n2. Upon closure of the detector switch S1, the sheet transport system starts the automatic loading of the leader sheet at step n3. Consequent upon the start of the automatic loading operation, and as soon as the leading end of the leader sheet arrive at the take-up spool 54, the take-up spool 54 is driven in the clockwise direction at step n4. Then, when the leader sheet is wound a substantially single turn around the take-up spool 54 with the leading end thereof secured thereto, the remainder of the leader sheet is held taught with the microswitch S2 consequently turned on at step n5, the take-up spool 54 is reversed to rotate in the counterclockwise direction at step n6. After the leader sheet has been wound around the take-up spool 54 for a predetermined time during which a sensitivity information marking is read out, the automatic loading terminates at step n7. Thereafter, various electric components are initialized at step n8, following a wait. When a PRINT key is subsequently depressed, the exposure process takes place at step n10. Upon completion of the exposure process, the take-up spool 54 is driven in the counterclockwise direction at step n11 to wind up the web of donor sheet so that the web of donor sheet bearing the latent image which has been formed during the exposure process can be pulled towards the pressure developing station. Then, at step n12, the pressure development takes place, followed by a stop of the rotation of the take-up spool 54 at step n13. Thereafter, a region of the web of donor sheet where no latent image has been formed is rewind at step n14 and the image forming apparatus is subsequently held under a wait before the PRINT key is depressed for the subsequent image forming.

It is to be noted that the process from steps n4 to n6 and n11 to n13 corresponds to a direction control means for controlling the direction of rotation of the take-up spool 54.

As hereinbefore fully described, according to the present invention, the automatic loading of the leader sheet takes place after the media cartridge accommodating therein the roll of donor sheet has been loaded into the image forming apparatus. During this automatic loading, the direction control means causes the take-up spool to rotate in the clockwise direction. The leader sheet having passed through the various rolls and having therefore been curled can be readily wound up around the take-up spool in a direction conforming to the direction in which it has been curled. After the formation of the substantially single turn of the leader sheet around the take-up spool with the leading end thereof bonded to the adhesive region on the take-up spool, the direction control means reverses the direction of rotation of the take-up spool so that the latter can be driven in the counterclockwise direction. At this time, the remainder of the leader sheet is folded 180° backwards to overlay the leading end of the same leader sheet along the score line, enabling the subsequent web of donor sheet to be wound around the take-up spool then driven in the counterclockwise direction. Since the leading end of the leader sheet is formed with the through-holes, the remainder of the leader sheet having been folded backwards to overlay the leading end thereof can be bonded to the adhesive region on the take-up spool through the through-holes, thereby ensuring the rigid securement of the leader sheet to the take-up spool.

On the other hand, during the image formation, the take-up spool is driven counterclockwise so that the web of donor sheet forms an angle of about 90° relative to the receptor sheet at the time of change in direction of rotation of the take-up spool, which angle progressively increase with increase in number of turns of the donor sheet taken up by the take-up spool. Therefore, it is clear that the receptor sheet can be positively and advantageously separated from the web of donor sheet.

Although the present invention has been described in connection with the preferred embodiment thereof with reference to the accompanying drawings, it is to be noted that various changes and modifications are apparent to those skilled in the art. Such changes and modifications are to be understood as included within the scope of the present invention, as defined by the appended claims, unless they depart therefrom.

What is claimed is:

1. An image forming apparatus which comprises:

a pair of pinch rolls operable to press a web of donor sheet, supplied from a roll thereof, and a receptor sheet together to accomplish an image development;

an automatic loading means operable to set a leader sheet, secured to a radially outermost end of the roll of donor sheet, in a transport passage means including the pinch roll pair and then to secure the leader sheet to a take-up spool having an adhesive region formed thereon for connection with the leader sheet; and a direction control means for controlling the take-up spool so as to rotate in a first direction about a longitudinal axis of the take-up spool during an automatic loading and so as to rotate in a second direction counter to the first direction about the longitudinal axis of the take-up spool during an image forming operation.

2. A leader sheet secured at one end to the radial outermost end of a roll of donor sheet of a type used in an image forming apparatus, said apparatus comprising a pair of pinch rolls operable to press a web of donor sheet, supplied from the roll thereof, and a receptor sheet together to accomplish an image development by the application of a pressure thereto and an automatic loading means operable to set the leader sheet in a transport passage means and then to secure the leader sheet to a take-up spool having an adhesive region formed thereon for connection with the leader sheet, said leader sheet comprising a free end portion remote from the donor sheet, said free end portion having a score line defined therein so as to extend perpendicular to a longitudinal sense of the sheet for facilitating a fold of the leader sheet when the direction of rotation of the take-up spool is changed, said free end portion also having at least one through-hole defined therein so that a corresponding portion of the leader sheet aligned with the through-hole when the free end portion thereof has been folded along the score line can be bonded to the adhesive region on the take-up roll through such through-hole.

* * * * *